United States Patent [19]

Mayhew et al.

[11] 3,734,616

[45] May 22, 1973

[54] APPARATUS FOR THE MANUFACTURE OF PRINTED CIRCUITS

[75] Inventors: Antony James Mayhew; Leonard Frederick Cheale, both of Essex, England

[73] Assignee: The Marconi Company Limited, London, England

[22] Filed: Mar. 15, 1971

[21] Appl. No.: 123,962

[30] Foreign Application Priority Data

May 20, 1970 Great Britain....................24,333/70

[52] U.S. Cl.....................................................355/89
[51] Int. Cl...........................................G03b 27/20
[58] Field of Search...........................355/73, 89, 91

[56] References Cited

UNITED STATES PATENTS 2,836,099 5/1958 Weishaupt..............................355/73
2,720,146 10/1955 Mears....................................355/89
2,814,975 12/1957 Mears....................................355/91
3,368,471 2/1968 Beato....................................355/91

*Primary Examiner*—John M. Horan
*Attorney*—Galdwin, Wight & Brown

[57] ABSTRACT

An optical contact printer for use in the manufacture of photographically produced printed circuit boards comprises two frame members slidably connected together. Photographic masters are held in registration on the inner faces of the frame members and between the photographic masters is inserted a printed circuit board coated in photo-resist. Air channels are supplied on the inner faces of the frame members abutting the photographic masters and air suction produced to hold the photographic masters against the frame members. Thus by sliding apart the frame members printed circuit boards may be inserted into the projector without the need to handle the photographic masks.

5 Claims, 2 Drawing Figures

Figure 1:
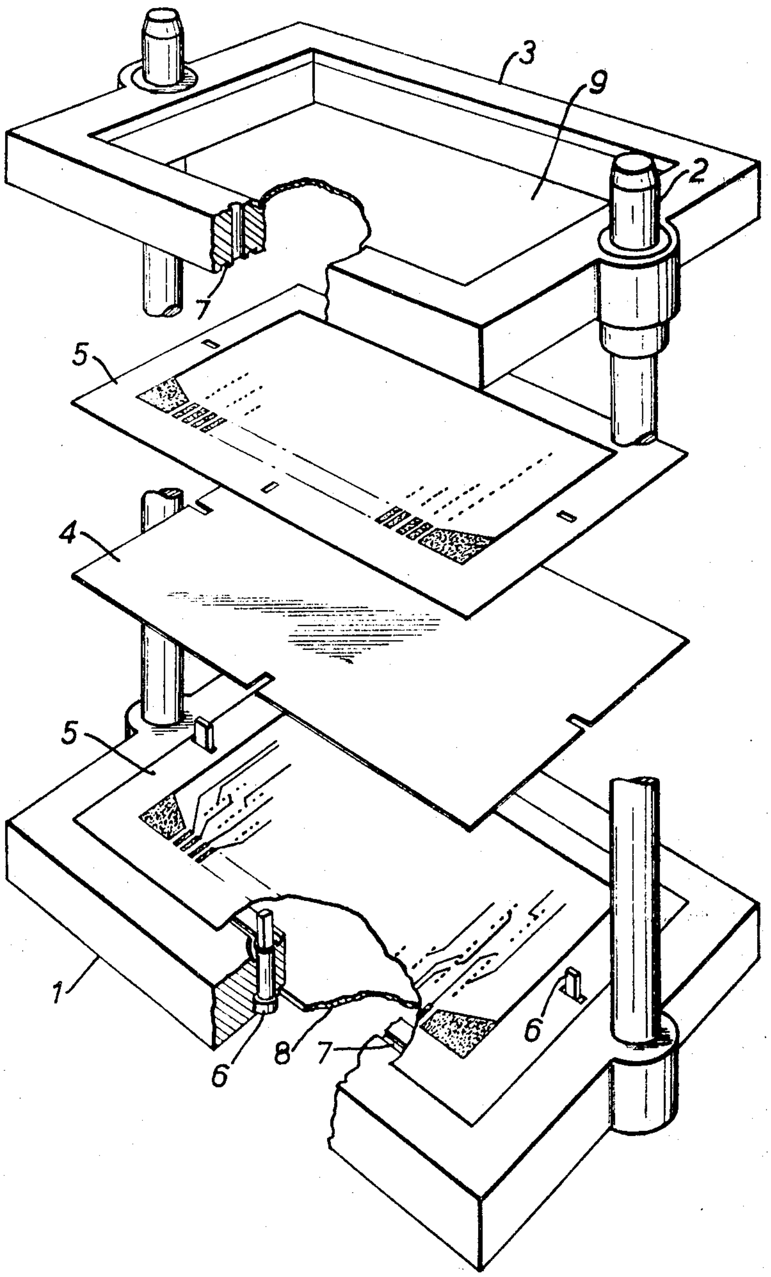

Inventors:
Antony James Mayhew
and
Leonard Frederick Cheale
BY Baldwin Wight & Brown
Attorneys Inventors:
Antony James Mayhew
and
Leonard Frederick Cheale
BY Baldwin Wight & Brown
Attorneys

APPARATUS FOR THE MANUFACTURE OF PRINTED CIRCUITS

This invention relates to apparatus for the manufacture of circuits and more specifically to apparatus for use in the manufacture of printed circuits by a method which involves projection of an image of a master pattern upon a conductively clad insulating board to determine the form of the printed circuit to be produced on said board. For the sake of brevity printed circuits made by such a method will hereinafter be referred to as "photographically produced printed circuits." The invention, though not exclusively limited to its application thereto, is primarily intended for and most advantageously applicable to apparatus for use in the manufacture of photographically produced double sided printed circuit boards, i.e, boards with photographically produced printed circuits on both sides thereof.

The usual method of making a photographically produced printed circuit involves the steps of preparing a patterned master which is in accordance with the circuit which is to be produced and which is in the form of a thin film on which the pattern has been photographed; positioning the film on a conductively clad insulating board which has been previously coated with a layer of photo-resist material; exposing the resist to light (commonly ultra-violet light) through the film; removing the film; developing the photo-resist layer on the board; and then applying a well known etching process to leave only the desired circuit, determined by the master, on the board. For economical mass production it is obviously desirable to use the same master over and over again to produce a sequence of similar printed circuits. In the case of a double sided board two masters are used and images thereof are photographically produced one on one side and the other on the other. Again in the interests of economical mass production, it is desirable to produce the two images simultaneously on the two sides of the board. It is obviously necessary that these images be accurately and correctly positioned in relation to one another on the two sides of the board if only because, in practice, it is usually required to have electrical connections (and sometimes many such connections) made through the board from points in the circuit on one side to points in the circuit on the other. Such connections are commonly made by means of plated-through holes. The requirement of accurate registration with one another of the circuits on the two sides of the board imposes strict manufacturing tolerances and these are normally satisfied by the use of accurately positioned registration marks on the sides of the board and on the photographic masters.

The usual way of achieving registration is to mount the board and the two masters (one on each side) in a contact printer in which the board and the masters are clamped and which has registration pins or dowels in positions to register with holes or slots in the two masters, these holes or slots constituting the registration marks above-mentioned. In this way the masters are correctly registered and the frame assembly is then clamped on them to hold them in registration before the light is switched on. When this method is practiced in printers of known construction, with the masters used over and over again, it involves the defect that there is considerable handling of the masters. Each time a new board is to be exposed at least one master must be removed to allow the new board to be substituted for the one last exposed and the removed master must be replaced in correct position. This is not only time consuming but the repeated handling of a master, its removal and replacement tends to wear the registration holes or slots in the master which is only, as stated, a thin film and very susceptible to wear and damage in handling. In particular, the repeated insertion of the pins or dowels in the holes or slots is liable to distort them with consequent deterioration in positional accuracy. Moreover continual handling of the masters seriously shortens their useful life in other respects and makes it necessary to replace them frequently.

The present invention seeks to overcome these disadvantages and difficulties.

According to this invention a contact printer for use in the manufacture of photographically produced printed circuits and adapted to hold in registration two photographic masters one each side of a printed circuit board for exposing images of said masters on said board comprises a pair of frame members at least one of which is movable between two positions in one of which a board and at least one master can be held between said members and in another of which the board can be removed and replaced; master locating means in at least one of said members and adapted to cooperate with locating means on an inserted master to hold the same in a pre-determined position in relation to the members; and suction means in at least said movable member for holding a master (once placed in position in relation to said member) by suction against said member even when said member is moved. In this way the need for excessive handling is avoided for a master, once in position against the movable member, will be retained there while a board is being changed.

Preferably the frame assembly has fixed and movable members each of which is provided with suction means for holding a master against itself by suction.

Preferably the suction means comprise a peripheral groove in the member in which it is provided said peripheral groove communicating with a port or pipe to which negative pressure may be applied. Preferably positive gas pressure means are also provided for pressing the master or masters against the surface or surfaces of an inserted board when the members are in the position for exposing the board to light through the master or masters.

In a preferred embodiment the frame assembly has two frame members each of which has a peripheral suction groove in its edge portion and said members are so formed that when they are in the position for exposing an inserted board to light they co-operate to form a gas retaining chamber inside said edge portions, means being provided for admitting air under pressure through said members to said chamber so as to press inserted masters on both sides of an inserted board against said board by air pressure. Obviously in an embodiment of this nature the chamber must be gas tight enough to permit the required air pressure to be built up to hold a master against a board. It does not, however, require in practice any high degree of gastightness: indeed if the chamber is provided with a deliberate air leak, the required gas pressure can be built up while air is flowing through the chamber and thus providing a measure of cooling for the masters.

This invention is illustrated in the accompanying drawings which show one embodiment thereof. In the drawings FIG. 1 is an exploded perspective view of the embodiment and includes representations of a board and masters on both sides thereof and FIG. 2 is a sectioned view, broken away and showing part of the embodiment of FIG. 1.

Figure 2:
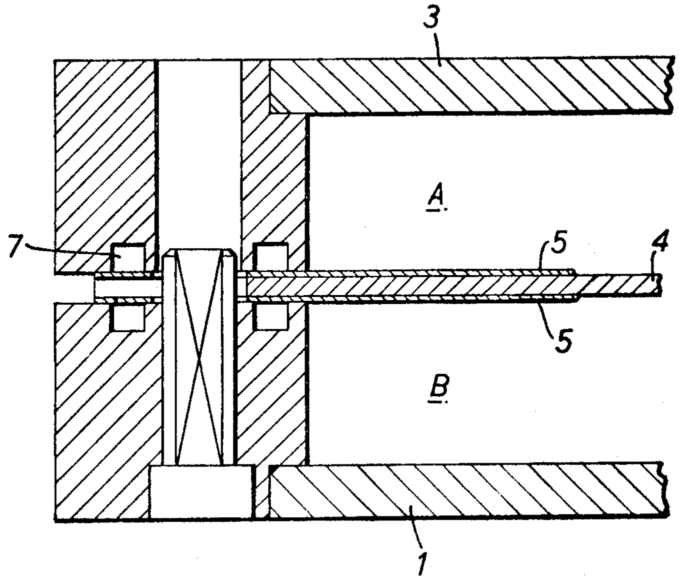

Referring to FIG. 1, an apertured base frame member 1 shown therein includes two stout vertical pillars 2 rigidly attached to the base frame 1, and which are positioned to slidably accept an apertured top frame member 3. A printed circuit board blank 4 is shown positioned between the base frame 1 and the top frame 3. The board 4 is composed of an electrically insulating material and is coated on both faces with a layer of an electrically good conductive material which may be for example copper. Sandwiched between the base frame 1 and the board 4, and between the board 4 and the top frame 3 are two patterned masters which in the present embodiment are photographic masks 5. Each photographic mask 5 consists of a thin flexible transparent film (which is commonly approximately seven thousandths of an inch thick) bearing an opaque pattern on the surface of the transparent film nearest to the board 4. This opaque pattern is usually a negative image of the conductive pattern that it is desired to reproduce on the face of the board 4 with which it is placed in contact. However, whether a positive or negative image is used depends on the particular process by which the desired conductive pattern is formed on the board 4.

In order that the conductive patterns produced on each face of the board 4 are precisely aligned one with another registration pins or dowel pins 6 are incorporated in the base frame 1. In the example shown in FIG. 1, there are four dowel pins 6 which project from the upper surface of the base frame 1, and which may engage in accurately positioned slots in the board 4 and in each of the photographic masks 5.

The upper surface of the base frame 1 and the lower surface of the top frame 3 include shallow grooves 7 let into the surface, and which are positioned to follow the perimeter of the aperture in each frame, and also to completely surround the base of each dowel pin 6 as shown. The grooves 7 in each frame are connected to a vacuum apparatus (not shown) which is capable of providing the required suction. The aperture in the base frame 1 is closed by a sheet of rigid transparent glass 8 at its lower surface and similarly the aperture of the top frame 3 is closed by a sheet of rigid transparent glass 9. In each case the transparent glass is attached to the respective frame to effect an airtight seal.

The apparatus is used in operation as follows. The top frame 3 is raised from the base frame 1 so that the photographic masks 5 may be inserted, and located by the dowel pins 6 in the correct position. The lower photographic mask 5 is positioned with its opaque pattern uppermost, and conversely the upper photographic mask 5 is positioned with its opaque pattern on the underside. The top frame 3 is lowered on to the dowel pins 6 firmly sandwiching the two photographic masks 5. A vacuum is produced in the grooves 7 by a vacuum pump (not shown) thereby clamping the lower mask 5 to the base frame 1 and the upper mask 5 to the top frame 3. With the masks thus clamped the top frame 3 is raised together with the upper mask, and a blank board 4 placed over the lower mask 5 and registered with the dowel pins 6. Before insertion the blank board 4 is coated on both faces with a photo-resist material. Such photoresist materials are well known in this art and it is not necessary to discuss fully the processes involved in the application and use of these materials.

The top frame 3 is then lowered on to the dowle pins 6. To ensure that the masks 5 are in close contact with the board 4 a positive air pressure is applied to the cavities enclosed by the frames 1 and 3, the transparent glass sheets 8 and 9 and the masks 5, via an inlet port in each frame 1 and 3 (not shown). An outlet port (also not shown) is also provided to permit a through flow of air to cool the masks 5. This is highly desirable since the masks 5 could otherwise overheat when subjected to the intense illumination required to expose the photo-resist material. When the board 4 has been exposed to the illumination the top frame 3 is raised, the upper mask 5 rising in contact with the top frame 3, and the board 4 is removed. The board 4 is subsequently processed using well known printed circuit board production techniques to produce the desired end product.

It will be appreciated that the process may be repeated as required without the need to handle either of the masks 5 at all. By this means the life expectation of the masks 5 is considerably extended, the only requirement being that the vacuum is pulled whenever the top frame 1 is to be raised, to hold the masks 5 securely in position.

FIG. 2 shows a section view through part of the apparatus shown in FIG. 1, but in the closed position. As can be clearly seen, the board 4 is sandwiched between the two masks 5, each mask 5 being clamped to either the base frame 1 or the top frame 3 by means of the vacuum pulled in the grooves 7. The positive air pressure which may be produced in the cavities designated A and B serves, as already stated, to ensure that the masks are held in close contact with the board 4 over their entire surface.

We claim:

1. A contact printer for use in the manufacture of photographically produced printed circuits and adapted to hold in registration two photographic masters one each side of a printed circuit board for exposing images of said masters on said board said assembly comprising a pair of frame members at least one of which is movable between two positions in one of which a board and at least one master can be held between said members and in another of which the board can be removed and replaced; master locating means in at least one of said members and adapted to cooperate with locating means on an inserted master to hold the same in a predetermined position in relation to the members; suction means in at least said movable member for holding a master (once placed in position in relation to said member) by suction against said member even when said member is moved; and positive gas pressure means in at least said movable member for pressing the master against the surface of an inserted board when the members are in the position for exposing the board to light through the master.

2. A contact printer for use in the manufacture of photographically produced printed circuits and adapted to hold in registration two photographic masters one each side of a printed circuit board for exposing images of said masters on said board said assembly comprising a pair of frame members at least one of which is movable between two positions in one of which a board and at least one master can be held between said members and in another of which the board can be removed and replaced; master locating means in at least one of said members and adapted to co-operate with locating means on an inserted master to hold the same in a predetermined position in relation to the members; suction means in at least said movable member for holding a master (once placed in position in relation to said member) by suction against said member even wlen said member is moved; each of the two frame members being provided with a peripheral suction groove in its edge portion and said members being so formed that when they are in the position for exposing an inserted board to light they co-operate to form a gas retaining chamber inside said edge portions, the suction grooves in said two members forming part of said suction means; and means for admitting air under pressure through said members to said chamber so as to press inserted masters on both sides of an inserted board against said board by air pressure.

3. A frame assembly for use in the manufacture of photographically produced printed circuits comprising in combination:

a pair of separable frame members movable between separated and closed conditions;

locating pin means acting between said frame members for locating a printed circuit blank and a pair of photographic masters sandwiching said blank therebetween in predetermined face-to-face registry bertwen said frame members;

both of said frame members being of open form each to define a circumscribing body having one face opposed to the other frame member and adapted marginally to engage a respective one of said photographic masters, a pair of transparent covers, one on each of said frame members and defining a chamber between it and said respective photographic master;

a pair of suction means, one on said one face of each frame member selectively to hold said respective photographic master to the associated frame member in correctly registered condition thereon when the two frame members are separated; and means for selectively pressurizing each said chamber to force said photographic masters into intimate contact with the printed circuit blank when said frame members are in closed condition.

4. A frame assembly as defined in claim 3 including means connecting said frame members for holding them in face-to-face parallelism throughout their movement between separated and closed conditions.

5. A frame assembly as defined in claim 4 wherein said frame members are horizontally disposed and the last mentioned means comprises a pair of vertical pillars fixed to the lower frame member and slidably engaged by the upper frame member.

* * * * *